United States Patent [19]

Ohsawa et al.

[11] 4,058,771
[45] Nov. 15, 1977

[54] DOUBLE-BALANCED FREQUENCY CONVERTER

[75] Inventors: Mitsuo Ohsawa, Fujisawa; Wataru Yamatani, Hatogaya, both of Japan

[73] Assignee: Sony Corporation, Tokyo, Japan

[21] Appl. No.: 735,042

[22] Filed: Oct. 22, 1976

[30] Foreign Application Priority Data

Oct. 27, 1975 Japan .................. 50-129030

[51] Int. Cl.$^2$ .................................... H04B 1/26
[52] U.S. Cl. .................. 325/446; 325/451; 325/492; 328/15; 307/271
[58] Field of Search ............ 325/430, 438, 439, 442, 325/445, 446, 449, 450, 451, 492, 318; 321/69 R; 307/260, 271, 288, 296, 313; 328/15, 19

[56] References Cited

U.S. PATENT DOCUMENTS

| | | | |
|---|---|---|---|
| 3,133,160 | 5/1964 | Catto | 325/451 |
| 3,302,118 | 1/1967 | Schoen | 325/451 |
| 3,491,301 | 1/1970 | Thompson | 325/451 |
| 3,555,303 | 1/1971 | Kozawa et al. | 325/438 |
| 3,949,306 | 4/1976 | Watanabe et al. | 325/451 |

*Primary Examiner*—Robert L. Griffin
*Assistant Examiner*—Jin F. Ng
*Attorney, Agent, or Firm*—Lewis H. Eslinger; Alvin Sinderbrand

[57] ABSTRACT

A frequency converter of the type having a local oscillating stage for producing a local oscillating signal and a double-balanced type mixing stage provided with a first pair of inputs for receiving a signal to be frequency converted and a second pair of inputs for receiving the local oscillating signal. The output of the mixing stage can be connected through a tuned circuit so as to frequency convert the input signal to an intermediate frequency (IF) signal. The local oscillating stage includes a first pair of differentially-connected transistors, the collector electrode of one being connected to a resonant circuit and, additionally, through an RC positive feedback circuit to the base electrode of the other transistor. The double-balanced type mixing stage includes a second pair of differentially-connected transistors, one of which being connected in cascade with a first differential amplifier and the other of which being connected in cascade with a second differential amplifier. The base electrodes of the second pair of differentially-connected transistors receive the local oscillating signal which is applied thereto in opposite phase relation. The first and second differential amplifiers both receive the input signal which is applied thereto in opposite phase relation. A DC bias circuit is provided for applying substantially equal bias voltages through equal impedances, such as resistors, to both pairs of differentially-connected transistors. Preferably, the DC bias circuit includes an emitter-follower.

16 Claims, 1 Drawing Figure

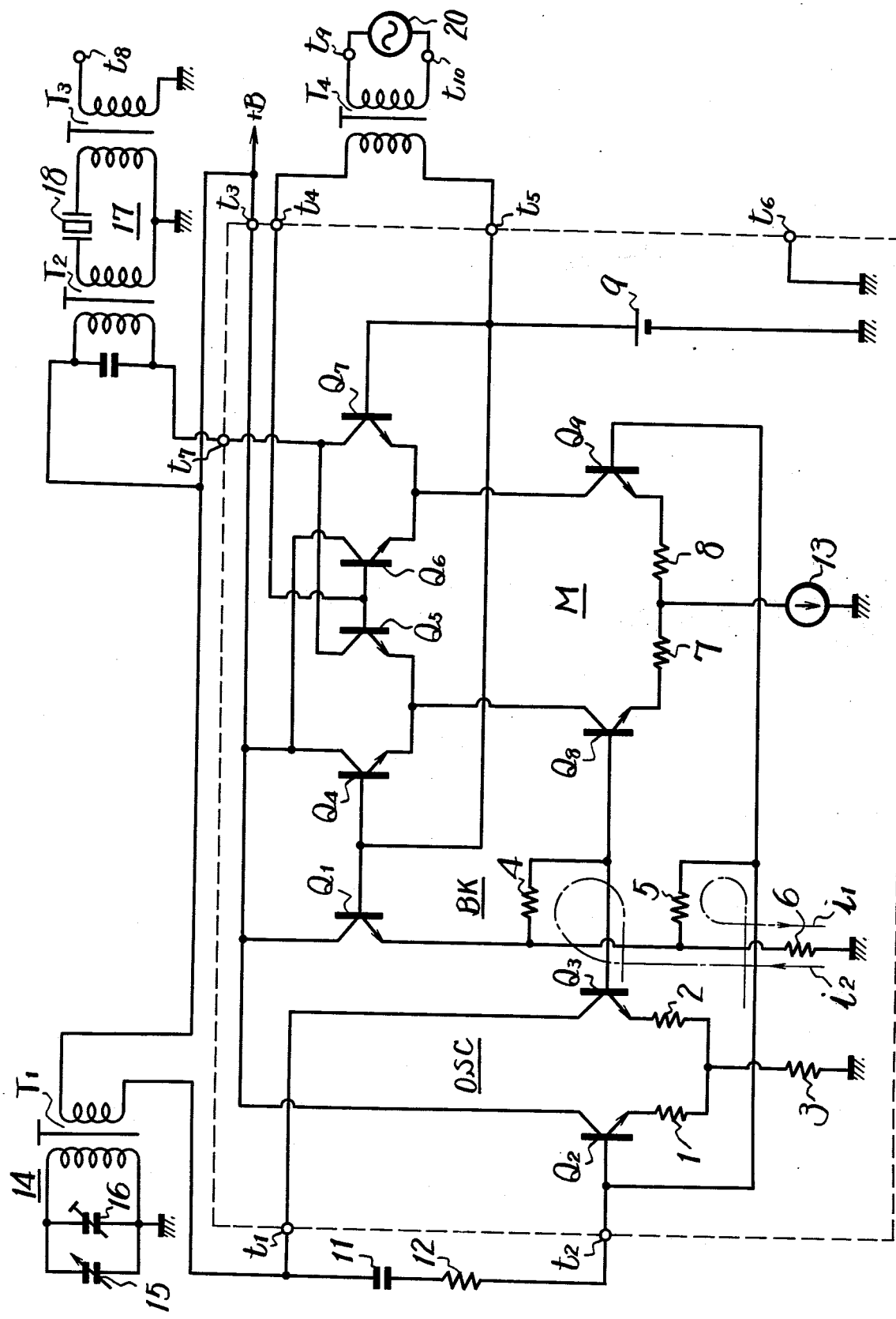

DOUBLE-BALANCED FREQUENCY CONVERTER

BACKGROUND OF THE INVENTION

This invention relates to a frequency converter and, more particularly, to an improved frequency converter wherein the frequency of an input signal is converted to a predetermined frequency, such as an intermediate frequency (IF), and wherein the possibility of producing a spurious noise or noise due to temperature drift of the circuit components is signficantly minimized.

Frequency converters are well-known to the prior art for use in, for example, amplitude modulation (AM) receivers wherein the information in a received broadcast signal is converted to an IF signal for demodulation. Another use of the frequency converter is, for example, in a video signal recording system wherein chrominance components are converted to a lower frequency in a recording operation and reproduced chrominance components are reconverted to their longitudinal frequency during a playback operation. Various other uses of frequency converters are readily apparent; and for the purpose of the present description, such use will be described in the environment of a radio receiver wherein the received RF signal is converted to an IF signal.

A known type of frequency converter is formed of a local oscillator for generating a local oscillating and a double-balanced type mixer which is supplied with the input signal to be frequency-converted by the local oscillating signal. The local oscillator includes a differential amplifier and the double-balanced type mixer includes a pair of differential amplifiers each of which being connected in cascade with yet another differential amplifier. In use, the high frequency signal which is to be frequency-converted is supplied to the pair of differential amplifiers and the output signal from the local oscillator is supplied to the further differential amplifier. In this manner, as each stage of the further differential amplifier is driven alternately by the local oscillating signal, currents flow through the respective ones of the pair of differential amplifiers so that the signals are multiplied, or mixed, from which the desired IF signal can be derived.

In this type of prior art frequency converter, the output signal supplied by the local oscillator to the doublebalanced type mixer is an unbalanced signal. Unfortunately, this has the result of producing a spurious signal, or noise. Another disadvantage in this type of prior art frequency converter is that the differential amplifiers in the local oscillator and in the double-balanced type mixer, although supplied with DC bias voltages, generally are supplied with such voltages from different bias sources. This requires a relatively complex bias circuit configuration. Also, since separate bias sources are used, the effect of temperature drift on one is not necessarily matched or compensated by the influence of temperature drift of the other. Consequently, noise due to such temperature drive deleteriously affects the frequency-converted output signal.

OBJECTS OF THE INVENTION

Therefore, it is an object of the present invention to provide an improved frequency converter which avoids the problems heretofore present in prior art devices.

Another object of this invention is to provide a frequency converter in which the local oscillating signal is supplied as a balanced signal to a mixer so as to minimize, or suppress, the occurrence of a spurious signal or noise.

A further object of this invention is to provide an improved frequency converter formed of a local oscillator stage having a differential amplifier and a double-balanced type mixer stage formed of at least one differential amplifier, and including a common source of bias voltage for these differential amplifiers so as to simplify the bias circuit configuration and also to minimize the effects of temperature drift and thus suppress noise due to such temperature drift.

An additional object of this invention is to provide an improved frequency converter wherein a local oscillating signal produced by the local oscillating stage is supplied to a double-balanced type mixer stage for converting the frequency of an input signal also supplied to the mixer stage and wherein possible influences on the DC power supply voltage or ground potential are suppressed.

Various other objects, advantages and features of this invention will become readily apparent from the ensuing detailed description, and the novel feature will be particularly pointed out in the appended claims.

SUMMARY OF THE INVENTION

In accordance with this invention, a frequency converter is provided with a local oscillating stage for producing a local oscillating signal; a double-balanced type mixing stage for receiving an input signal to be frequency converted and for receiving the local oscillating signal for frequency converting the input signal; and a common DC bias circuit for applying substantially equal bias voltages to the local oscillating stage and to the mixing stage. In a preferred embodiment, the local oscillating stage is comprised of a first differential circuit coupled to a resonant circuit, and the double-balanced type mixing stage is comprised of a second differential circuit connected in cascade with first and second differential amplifiers, respectively. Preferably, the bias circuit is comprised of an emitter-follower transistor supplied with a predetermined DC level whose emitter output is connected through a common impedance circuit to the differential circuit included in the local oscillating stage and to the differential circuit included in the mixing stage.

In this configuration, the differential amplifiers are supplied with the input signal to be frequency converted and the differential circuit included in the mixing stage receives the local oscillating signal which is supplied as a balanced signal.

BRIEF DESCRIPTION OF THE DRAWING

The following detailed description, given by way of example, will best be understood in conjunction with the accompanying drawing FIGURE which is a schematic diagram illustrating a preferred embodiment of the frequency converter.

DETAILED DESCRIPTION OF A PREFERRED EMBODIMENT

Referring now to the drawing, the illustrated frequency converter is comprised of an oscillating stage OSC for generating a local oscillating signal, a mixer stage M for receiving an input signal supplied thereto from a source 20 and for frequency converting this input signal by the local oscillating frequency, and a bias circuit BK which is adapted to provide equal bias voltages to the local oscillating stage and to the mixer stage.

Preferably, the frequency converter is adapted to be constructed as a monolithic integrated circuit, depicted by the broken line, having respective terminals $t_1$ through $t_7$ to which external circuitry may be connected.

The local oscillating stage is comprised of a differential circuit formed of differentially-connected transistors $Q_2$ and $Q_3$ whose emitters are connected through resistors 1 and 2 to a common junction, this junction being connected to a reference potential, such as ground, by a resistor 3. Desirably, transistors $Q_2$ and $Q_3$ have matching characteristics, and resistors 1 and 2 are of equal resistance values. As may be appreciated, this can be achieved in accordance with conventional integrated circuit fabricating technology. A positive feedback circuit formed of the RC circuit having capacitor 11 connected in series with resistor 12 serves to couple the collector of transistor $Q_3$ to the base of transistor $Q_2$. As shown, this positive feedback circuit may be formed externally of the monolithic integrated circuit and thus is connected between terminals $t_1$ and $t_2$, these terminals being coupled to the collector of transistor Q3 and the base of transistor $Q_2$, respectively. A resonant LC circuit 14 is connected to the collector of transistor $Q_3$ and, thus, is coupled to terminal $t_1$. In particular, this resonant circuit is formed of adjustable parallel-connected capacitors 15 and 16 and a transformer $T_1$, one winding of which also is connected in parallel with the capacitor. An operating voltage is supplied from a suitable DC source or power supply +B through the other winding of transformer $T_1$ to terminal $t_1$, as shown. As also shown, a common terminal of resonant circuit 14 is coupled to ground.

The mixer stage is of the so-called double-balanced type mixer comprised of a differential circuit formed of differentially-connected transistors $Q_8$ and $Q_9$, these transistors being connected in cascade with respective differential amplifiers formed of differentially-connected transistors $Q_4$, $Q_5$ and differentially-connected transistors $Q_6$, $Q_7$. The local oscillating signal is supplied across the bases of transistors $Q_8$ and $Q_9$ in opposite phase relation. Hence, this local oscillating signal is supplied as a balanced signal. The collector of transistor $Q_8$ is connected to the common-connected emitters of differentially-connected transistors $Q_4$ and $Q_5$; and the collector of transistor $Q_9$ is connected to the common-connected emitters of differentially-connected transistors $Q_6$ and $Q_7$. The emitters of transistors $Q_8$ and $Q_9$ are connected to a common junction through resistors 7 and 8, this junction being coupled to ground by a constant current circuit 13. Preferably, transistors $Q_8$ and $Q_9$ are matched, and resistors 7 and 8 are of equal resistance values.

The differential amplifier formed of transistors $Q_4$ and $Q_5$ and the differential amplifier formed of transistors $Q_6$ and $Q_7$ both are adapted to receive the input signal from source 20. Accordingly, a transformer $T_4$ couples the signal from source 20 to these differential amplifiers. As shown, a primary winding of transformer $T_4$ includes terminals $t_9$ and $t_{10}$ coupled to source 20, and the secondary winding of this transformer is connected across terminals $t_4$ and $t_5$. Terminals $t_4$ is connected in common to the base electrodes of transistors $Q_5$ and $Q_6$ in the respective differential amplifiers; and terminal $t_5$ is connected in common to the base of transistors $Q_4$ and $Q_7$ in these respective differential amplifiers. As may be appreciated, signal source 20 represents any suitable signal receiving device, such as an RF stage, and the transformer coupling of the input signal to terminals $t_4$ and $t_5$ results in applying the signal to these terminals in opposite phase relation. Thus, both the differential amplifier formed of transistors $Q_4$ and $Q_5$ and the differential amplifier formed of transistors $Q_6$ and $Q_7$ are driven by this oppositely-phased input signal.

The collector of transistor $Q_4$ in one differential amplifier is connected in common with the collector of transistor $Q_6$ in the other differential amplifier. Similarly, the collectors of transistors $Q_5$ and $Q_7$ are connected in common. The input signal supplied to the differential amplifiers and the local oscillating signal supplied to transistors $Q_8$ and $Q_9$ are multiplied, or mixed, in the mixer stage. In order to recover a predetermined frequency from the mixed signals, one set of common-connected collectors, such as the collectors of transistors $Q_5$ and $Q_7$, is connected to a selecting circuit 17. Hence, the other set of common-connected collectors, that is, the collectors of transistors $Q_4$ and $Q_6$, is coupled directly to the DC source +B which is supplied to terminal $t_3$. Signal selecting circuit 17 is a bandpass filter whose pass band corresponds to the IF signal. For example, when the illustrated frequency converter is used in a AM signal receiver, the band-pass filter has a frequency pass band centered at 450 KHz. The illustrated band-pass filter typically is formed of IF transformers $T_2$ and $T_3$ which are connected through a resonant element 18, such as quartz resonator. The primary winding of transformer $T_2$ is connected in parallel with a capacitor to form a resonant LC circuit, the secondary winding of transformer $T_2$ is connected through resonant element 18 to the primary winding of transformer $T_3$ and the secondary winding of the latter transformer is connected to an output terminal $t_8$ from which the IF signal is derived. That is, the frequency-converted version of the input signal supplied by source 20 is produced at output terminal $t_8$. Signal selector 17 is connected to the collectors of transistors $Q_5$ and $Q_7$ by connecting one end of the primary winding of transformer $T_2$ to terminal $t_7$ and the other end of this primary winding to the DC power supply +B. Signal selecting circuit 17 is coupled to ground, as shown.

The bias circuit is formed of an emitter-follower transistor $Q_1$ whose collector is connected to terminal $t_3$ to receive the operating DC voltage. The emitter of transistor $Q_1$ is coupled to ground by an emiter resistor 6. A predetermined DC level, represented as the DC source 9, is applied to the base of transistor $Q_1$. It may be recognized that this predetermined DC level may be produced by conventional circuitry and, in the interest of brevity, further description thereof is not provided.

The output of emitter-follower transistor $Q_1$, that is, its emitter, is connected through resistors 4 and 5 to the differentially-connected transistors $Q_2$ and $Q_3$ included in the local oscillating stage and to the differentially-connected transistors $Q_8$ and $Q_9$ included in the mixing stage. As shown, the bases of transistors $Q_3$ and $Q_8$ are connected in common to resistor 4, thereby receiving the same bias voltage. Similarly, the bases of transistors $Q_2$ and $Q_9$ are connected in common to resistor 5 so as to receive the same bias voltage. Preferably, resistors 4 and 5 are equal such that substantially equal bias voltages are applied to each of transistors $Q_2$, $Q_3$, $Q_8$ and $Q_9$. The predetermined DC level 9 is applied to the bases of the remaining transistors. That is, this DC level is applied directly to the bases of transistors $Q_4$ and $Q_7$, and is applied through the secondary winding of transformer $T_4$ to the bases of transistors $Q_5$ and $Q_6$. This predetermined DC level is derived from the operating voltage produced by the DC power supply +B.

The operation of the illustrated frequency converter now will be described. The local oscillating stage is a local signal generator operating as a free-running oscillator whose frequency is determined by the capacitance of capacitor 11 and the resistance of resistor 12 in the positive feedback circuit. As a free-running oscillator, transistors $Q_2$ and $Q_3$ oscillate in push-pull relation. Hence, the base currents of these transistors are AC, or oscillating signals that are opposite in phase with respect to each other. Resistors 4 and 5 serve as load impedances for the base of transistors $Q_3$ and $Q_2$, respectively. Hence, base voltages are produced which are proportional to the product of the respective base currents and the resistance values of resistors 4 and 5. These voltages are the local oscillator outputs which are supplied as balanced signals to the bases of transistors $Q_8$ and $Q_9$. That is, the signal appearing across the bases of transistors $Q_3$ and $Q_2$ is applied across the bases of transistors $Q_8$ and $Q_9$, respectively. Therefore, transistors $Q_8$ and $Q_9$ are driven in a balanced condition, thereby suppressing any spurious signals that might be produced but for this balanced condition. Accordingly, the signals applied to transistors $Q_8$ and $Q_9$ are of opposite phases.

In addition, the voltage provided at the emitter of emitter-follower transistor $Q_1$ is supplied through resistor 4 to the bases of transistors $Q_3$ and $Q_8$, and through resistor 5 to the bases of transistors $Q_2$ and $Q_9$. Since these resistors are equal, as noted above, the applied bias voltages likewise are equal. Furthermore, since the very same emitter-follower transistor is the source of this bias voltage, then any change caused by temperature drift will be applied equally to differentially-connected transistors $Q_2$ and $Q_3$ and to differentially-connected a balanced condition, thereby suppressing any spurious signals that might be produced but for this balanced condition. Accordingly, the signals applied to transistors $Q_8$ and $Q_9$ are of opposite phases.

In addition, the voltage provided at the emitter of emitter-follower transistor $Q_1$ is supplied through resistor 4 to the bases of transistors $Q_3$ and $Q_8$, and through resistor 5 to the bases of transistors $Q_2$ and $Q_9$. Since these resistors are equal, as noted above, the applied bias voltages likewise are equal. Furthermore, since the very same emitter-follower transistor is the source of this bias voltage, then any change caused by temperature drift will be applied equally to differentially-connected transistors $Q_2$ and $Q_3$ and to differentially-connected transistors $Q_8$ and $Q_9$. Therefore, even if the bias current is subject to change, the inherent common mode rejection characteristic of the differential circuit formed of transistors $Q_8$ and $Q_9$ will cancel, or suppress, the effect of this bias current change. Hence, noise due to temperature drift is avoided.

Transistors $Q_8$ and $Q_9$ are driven by the oppositely-phased local oscillating signals supplied thereto by the bases of transistors $Q_2$ and $Q_3$ so as to alternately establish emitter current paths for the common-connected emitters of transistors $Q_4$ and $Q_5$ and of transistors $Q_6$ and $Q_7$, respectively. Preferably, the input signal supplied from source 20 is of a higher frequency than the local oscillating signal. The double-balanced type mixer then multiplies, or mixes these signals, resulting in a frequency-converted, or IF signal at output terminal $t_8$ after the signals provided by the common-connected collectors of transistors $Q_5$ and $Q_7$ at terminal $t_7$ pass through the signal selector, or IF tuned circuit 17.

Although the bases of transistors $Q_2$ and $Q_3$ in the local oscillator stage are provided with oscillating currents, these currents do not cause corresponding oscillations in the circuit ground potential or in the DC operating voltage. This is because a component $i_1$ of the base current of transistor $Q_2$ flows from the base of this transistor through resistors 5 and 6 to ground in the direction shown. Similarly, a component $i_2$ flows from ground through resistors 6 and 4 to the base of transistor $Q_3$ in the illustrated direction. Since these components $i_1$ and $i_2$ are determined primarily by resistors 4 and 5, and since these resistors are equal, then $i_1$ equals $-i_2$. Hence, these components cancel each other so that effectively no current flows through resistor 6. Consequently, no oscillating current component will be superimposed onto the DC source current so as to flow in other circuits, and such other circuits will not be deleteriously affected thereby.

Although the present invention has been described in conjunction with a preferred embodiment thereof, it should be readily apparent that various changes and modifications in form and details can be made without departing from the spirit and scope of the disclosed invention. For example, the respective transistors have been illustrated and described as bipolar devices. Such transistors alternatively can be FET's or other conventional devices and, moreover, each transistor device may be formed of a single such transistor, Darlington-connected transistors or other conventional transistor amplifying devices. Hence, the foregoing designations of base, emitter and collector electrodes have been assumed for the embodiment using single bipolar transistors, and these designations are intended to refer to corresponding electrodes and terminals of other equivalent transistor devices, such as those mentioned above. It is intended that the appended claims be interpreted as including such equivalent devices as well as other changes and modifications that are readily apparent to one of ordinary skill in the art.

What is claimed is:

1. A frequency converter, comprising:

local signal generating means including a first differential circuit having a first pair of differentially-connected transistor means and a positive feedback circuit coupling the collector electrode of one of said first pair of transistor means to the base electrode of the other, said local signal generating means having a pair of output terminals for producing a local oscillating signal thereacross;

double-balanced type mixing means including a second differential circuit having a second pair of differentially-connected transistor means, a third differential circuit having a third pair of differentially-connected transistor means, and a fourth differential circuit having a fourth pair of differentially-connected transistor means, said second differential circuit having a pair of outputs coupled to said third and fourth differential circuits, respectively;

signal input means for supplying an input signal to be frequency-converted across the base electrodes of said third pair of transistors and across the base electrodes of said fourth pair of transistors;

means for applying said local oscillating signal produced across said local signal generating means output terminals to the base electrodes of said second pair of transistor means in opposite phase relation, whereby said input signal and said local oscillating signal are mixed in said double-balanced type mixing means;

selecting means coupled to the collector electrode of one of said third pair of transistor means and to the collector electrode of one of said fourth pair of transistor means to produce a frequency-converted output signal of selected frequency; and bias means coupled to said first and second differential circuits for applying the same DC bias voltages to both said circuits.

2. The frequency converter of claim 1 further comprising means for supplying an operating voltage to said local signal generating means, said double-balanced type mixing means and said bias means; and wherein said local signal generating means further includes a resonant circuit coupled to said collector electrode of said one transistor of said first pair of transistors, the collector electrode of the other transistor of said first pair of transistors being coupled directly to said operating voltage supply means.

3. The frequency converter of claim 2 wherein said first pair of transistors operate in push-pull relation and wherein said local signal generating means output terminals are provided at the respective base electrodes of said first pair of transistor means.

4. The frequency converter of claim 3 wherein the respective emitter electrodes of said first pair of transistors are connected to a reference level through substantially equal impedances.

5. The frequency converter of claim 3 wherein said bias means comprises emitter-follower means coupled to the respective base electrodes of said first pair of transistor means through substantially equal resistors, and to the respective base electrodes of said second pair of transistors through the same said resistors.

6. The frequency converter of claim 5 wherein said emitter-follower means is an emitter-follower transistor whose collector electrode is coupled directly to receive said operating voltage; and wherein said bias means further includes a source of DC voltage coupled to the base electrode of said emitter-follower transistor and to the respective base electrodes of said third and fourth pair of transistor means.

7. The frequency converter of claim 6 wherein said signal input means includes a pair of output terminals for providing said input signal thereat in opposite phase relation; and wherein the base electrode of one transistor means in said third pair of transistor means is connected in common with the base electrode of one transistor means in said fourth pair of transistor means to one of said last-mentioned output terminals, the base electrode of the other transistor means in said third pair of transistor means is connected in common with the base electrode of the other transistor means in said fourth pair of transistor means to the other of said last-mentioned output terminals, the collector electrodes of said one transistor means in said third pair of transistor means and said other transistor means in said fourth pair of transistor means are connected in common to said selecting means, and the collector electrodes of said other transistor means in said third pair of transistor means and said one transistor means in said fourth pair of transistor means are connected in common directly to receive said operating voltage.

8. The frequency converter of claim 23 wherein the emitter electrodes of said third pair of transistor means are connected in common and the emitter electrodes of said fourth pair of transistor means are connected in common; and wherein said pair of outputs of said second differential circuit are coupled to the respective collector electrodes of said second pair of transistor means, said last-mentioned pair of outputs being further coupled to said common-connected emitter electrodes of said third and fourth pair of transistor means, respectively.

9. The frequency converter of claim 1 wherein said selecting means comprises a tuned circuit, said circuit being tuned to an intermediate frequency.

10. The frequency converter of claim 1 wherein said positive feedback circuit in said local signal generating means is a series-connected RC circuit.

11. The frequency converter of claim 1 wherein said signal input means comprises an input signal source; and a transformer having input terminals connected to said signal source and output terminals connected to the common-connected base electrodes of one transistor in each said third and fourth pairs of transistor means and to the common-connected base electrodes of the other transistor in each said third and fourth pairs of transistor means, respectively.

12. A frequency converter comprising a local oscillating stage for producing a local oscillating signal; a double-balanced type mixing stage having a first pair of inputs for receiving a signal to be frequency converted, said signal being applied to said first pair of inputs in opposite phase relation, and a second pair of inputs for receiving said local oscillating signal thereat in opposite phase relation; means for supplying a DC operating voltage to said local oscillating stage and to said mixing stage; and a DC bias circuit for applying substantially equal bias voltages to said local oscillating stage and to said mixing stage, said bias circuit comprising an emitter-follower transistor whose collector electrode is coupled to said supply means and whose emitter electrode is connected to an emitter resistance means, means for applying a predetermined potential to the base electrode of said transistor, and common impedance means through which said emitter electrode is coupled both to said local oscillating stage and to said mixing stage.

13. The frequency converter of claim 12 wherein said local oscillating stage comprises a first pair of differentially-connected transistors, an LC resonant circuit coupled to the collector electrode of one of said transistors, and an RC circuit connecting said collector electrode to the base electrode of the other of said transistors in positive feedback relation; and wherein said emitter electrode of said emitter-follower transistor is coupled to the base electrodes of said differentially-connected transistors through said common impedance means.

14. The frequency converter of claim 13 wherein said double-balanced type mixing stage comprises a second pair of differentially-connected transistors, a first differential amplifier, and a second differential amplifier, the collector electrodes of said second pair of transistors being connected in cascade with said first and second differential amplifiers, respectively; the base electrodes of said second pair of differentially-connected transistors being provided with said second pair of inputs and said first and second differential amplifiers being provided with said first pair of inputs; and wherein said emitter electrode of said emitter-follower transistor is coupled to the base electrodes of said second pair of differentially-connected transistors through said common impedance means.

15. The frequency converter of claim 14 wherein said first differential amplifier includes an output terminal and said second differential amplifier includes an output terminal, said output terminals being connected in common to output means for deriving a frequency-converted signal.

16. The frequency converter of claim 15 wherein said local oscillating signal is provided in opposite phase relation at the base electrodes of said first pair of differentially-connected transistors; and wherein the base electrodes of said first pair of differentially-connected transistors are connected directly to the base electrodes of said second pair of differentially-connected transistors, respectively.

* * * * *